United States Patent [19] [11] 4,292,636

Egger et al. [45] Sep. 29, 1981

[54] PASSIVE REPLY DEVICE FOR USE IN THE AUTOMATIC WIRELESS TRANSMISSION OF MULTI-PLACE NUMERICAL INFORMATION BETWEEN ACTIVE INTERROGATION DEVICES AND SUCH PASSIVE REPLY DEVICES, WHICH ARE MOVABLE WITH RESPECT TO ONE ANOTHER AND METHOD OF MAKING THE SAME

[75] Inventors: Walter Egger, Munich; Egon Edinger, Graefelfing; Friedrich Pedall, Munich, all of Fed. Rep. of Germany

[73] Assignee: Siemens Aktiengesellschaft, Berlin & Munich, Fed. Rep. of Germany

[21] Appl. No.: 102,668

[22] Filed: Dec. 12, 1979

[30] Foreign Application Priority Data

Dec. 22, 1978 [DE] Fed. Rep. of Germany ....... 2855721

[51] Int. Cl.[3] .......................... G01S 13/80; H03J 5/14

[52] U.S. Cl. ................................. 343/6.5 SS; 334/44; 334/46

[58] Field of Search ................ 334/44, 46; 343/6.5 SS

[56] References Cited

U.S. PATENT DOCUMENTS

| | | | |
|---|---|---|---|
| 3,169,242 | 2/1965 | Davis et al. | 343/6.5 SS |
| 3,399,405 | 8/1968 | Daniel, Jr. | 343/6.5 SS |
| 3,657,671 | 4/1972 | Masters et al. | 334/44 X |
| 3,780,368 | 12/1973 | Northeved et al. | 343/6.5 SS |
| 3,959,792 | 5/1976 | Hildebrandt | 343/6.5 SS |

FOREIGN PATENT DOCUMENTS 2651950 5/1978 Fed. Rep. of Germany ........ 334/46

*Primary Examiner*—Malcolm F. Hubler
*Attorney, Agent, or Firm*—Hill, Van Santen, Steadman, Chiara & Simpson

[57] ABSTRACT

The invention relates to a passive reply device for use, for example, in automatic wireless transmission of multiplace numerical information between it and an active interrogation device which are movable with respect to one another, particularly for track-bound transport apparatus, which comprises a high frequency line section having a high frequency antenna at one end, and short circuited at its opposite end, and a plurality of high frequency coaxial resonators extending transversely to and carried by such line section, with a number of resonators being proportional to the number of places of the information to be transmitted. The resonators consist of individual elements which are inserted in appropriate bores of the line section with a press fit. The tuning of the individual resonators is determined by the particular shape of the bottom wall of each resonator, with the resonators otherwise being similar in construction. The invention also involves a novel method of effecting the tuning of the resonators by taking like resonators, formed from a relatively soft malleable metallic material and deforming the respective resonator bottom walls in axial direction inwardly and outwardly, by the application of external forces thereto, thereby effecting frequency shifts in the respective resonators.

11 Claims, 4 Drawing Figures

PASSIVE REPLY DEVICE FOR USE IN THE AUTOMATIC WIRELESS TRANSMISSION OF MULTI-PLACE NUMERICAL INFORMATION BETWEEN ACTIVE INTERROGATION DEVICES AND SUCH PASSIVE REPLY DEVICES, WHICH ARE MOVABLE WITH RESPECT TO ONE ANOTHER AND METHOD OF MAKING THE SAME

BACKGROUND OF THE INVENTION

The invention relates generally to an arrangement for the automatic wireless transmission of multi-place numerical information between active interrogation devices and passive reply devices which are movable with respect to one another, particularly for track-bound transport apparatus. The respective passive reply devices each utilize a plurality of resonators coupled to a high frequency line section, with the plurality of resonators being proportional to the number of places of the information to be transmitted. The varying resonant frequencies of said resonators determine, in connection with a mutual minimum interval, the wobble range for the interrogation signal transmitted by the interrogation device with a periodic change of frequency, with the interrogation device receiving the signals reflected from the reply device.

More particularly, the invention is directed to a novel construction of a passive reply device and the method of making the same.

Arrangements are known, for example, from German AS 19 01 890 and British Pat. No. 1,496,205 (German LP 24 25 182), in which the individual resonant frequencies are generated by means of resonators, for example quarter-wave coaxial resonators, coupled to a waveguide, said resonators being interrogated by means of a wobbled microwave signal. In this case, the reply device comprises two half-shells which are cooperable to form a rectangular waveguide and an antenna therefor, and further includes coaxial resonators which are integrally cast with the waveguide. In order to achieve favorable mass production costs, significant center frequency errors caused by fabrication tolerances can be expected. This center frequency error is compensated by means of a fundamental equalization. Thus, the informational variation involving different frequencies within a specific frequency range, requires an additional equalization of the resonators. The frequency equalization of the coaxial resonators usually is achieved by the utilization of additional timing elements which are introduced, in an appropriate manner, in the hollow space of the coaxial resonator. Thus, an electrically conductive pin can be inserted through the bottom wall of the resonator (short-circuit plane), whereby an inductive frequency shift results. This method requires a processing of the resonators which, at least in part, involves a significant outlay, namely boring, deburring and smoothing. This operation also involves the danger of a high rejection, since a single bore which is not to precise dimensions can result in the rejection of an entire half-shell. From an electrical standpoint, the use of a pin type equalization results in the further problem that, independently of the size of the frequency deviation, the pin influences the resonator open circuit band width and, thus, also the signal.

BRIEF SUMMARY OF THE INVENTION

The invention therefore has among its objects to provide an improved construction in devices of this type. The disadvantages above discussed are eliminated and a simple tuning of the resonators of the reply device may be readily achieved.

In accordance with the invention, the resonators, for example coaxial resonators, comprise individual tubular shaped elements, which are so constructed that the bottom walls (short circuiting) can be suitably deformed in axial direction by means of external forces, whereby such bottom wall can be deformed inwardly to generally impart a convex configuration thereto, or can be deformed outwardly to impart a concave configuration thereto, thus effecting a frequency shift in the deformed structure. This deformation can be facilitated by constructing the resonators from a relatively soft malleable metal, as for example, from a soft aluminum. Further, the respective resonators are assembled in corresponding bores of the high frequency line section with a press fit, which likewise is facilitated by the use of a soft malleable metal. The invention thus enables the fabrication of a passive reply device comprising only a structure forming a line section and the additional elements forming the respective resonators, without the use of individual tuning elements, fastening devices, etc., that might in time affect the satisfactory operation of the structure. In addition the invention enables the utilization of a very simple method of producing the resonators and tuning the same to enable the achievement of a reduction in manufacturing costs.

BRIEF DESCRIPTION OF THE DRAWINGS

In the drawing wherein like reference characters indicate like or corresponding parts.

DETAILED DESCRIPTION OF THE INVENTION

Figure 1:
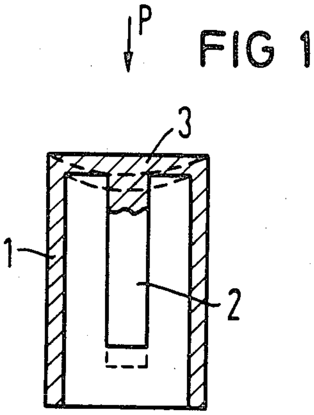
FIG. 1 is a longitudinal section of a coaxial resonator illustrating in broken lines the resonator bottom wall thereof deformed, in accordance with the invention, in inward axial direction.
Figure 2:
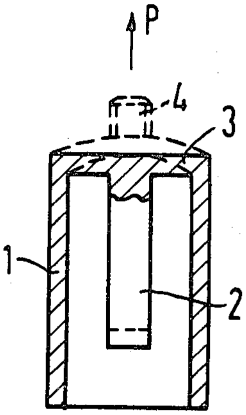
FIG. 2 is a similar longitudinal section view of a like coaxial resonator illustrating in broken lines the bottom wall deformed in an outward axial direction.
Figure 3:
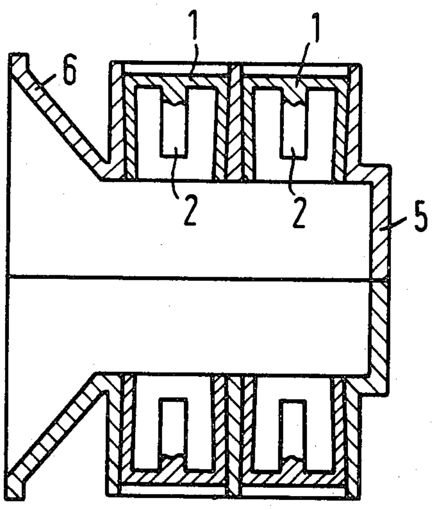
FIG. 3 is a longitudinal sectional view of a line section having the coaxial resonators inserted therein; and an antenna.

Referring particularly to FIGS. 1 and 2, the reference numeral 1 designates generally a coaxial resonator comprising a tubular cup-shaped member open at one end and closed at the other end to form a short-circuiting bottom wall from which extends, into the interior space thereof an inner rod-like coaxial conductor stub 2.

As illustrated in solid lines in FIGS. 1 and 2, the coaxial resonators thus far described may be of identical construction in which the bottom wall 3 initially is substantially flat and extends normal to the axis of the resonator.

The resonator structures are suitably fabricated from a relatively soft malleable metallic material, as for example aluminum, and the desired frequency equalization may be achieved solely by effecting a deformation of the resonator bottom wall 3 in an axial direction either inwardly or outwardly, without the necessity of introducing a tuning element within the coaxial resonator. Thus, by applying pressure to the exterior of the resonator bottom wall 3, the latter will be deformed inwardly, as illustrated in broken lines in FIG. 1, to produce a shift to a lower frequency. Similarly, by applying tension forces to the bottom wall from the exterior side thereof, such wall may be bulged outwardly, as illustrated in broken lines in FIG. 2, to impart a frequency shift to a higher frequency. The direction of the applied force P is indicated in FIGS. 1 and 2 by the respective arrows.

As illustrated in FIG. 2, a projection such as a peg-like member 4 can be attached to or integrally formed with the resonator bottom wall 3 at the exterior side thereof, which projection forms means by which force-applying means may be attached to the resonator bottom wall, for example for exerting tension forces thereto. This method of tuning has the distinct advantage that, by the application of the deforming forces to the exterior of the resonator wall, measurements can be simultaneously carried out during the tuning operation to enable a very accurate tuning of the structure during either internal or external deformation of the resonator end wall. The tuning range thus depends solely on the ductile characteristics of the resonator material. In order to achieve a relatively great tuning range, advantageously the resonators are manufactured of a soft malleable metallic material such as soft aluminum, and are formed, for example, by a cutting operation or by a cold forming pressure operation, with the respective resonators being mounted in the line section by a press fit. Advantageously the line section may comprise a rectangular wave guide 5 and the antenna 6 which are constructed in the form of two aluminum die cast half shells which are subsequently assembled.

The present invention thus provides a very simple construction having a minimum number of components, at the same time providing a relatively large tuning range, without producing any change in the resonator open circuit band width as a result of the tuning operations; thus, assuring a constant signal amplitude. Further the arrangement is distinguished by a high mechanical stability, is very insensitive to impacts and shock loads, and can be employed over relatively great temperature ranges. Further, the present invention enables the utilization of a method of manufacturing which likewise is very simple, eliminating drilling operations at the resonator locations and similar operations with respect to the tuning thereof.

Figure 4:
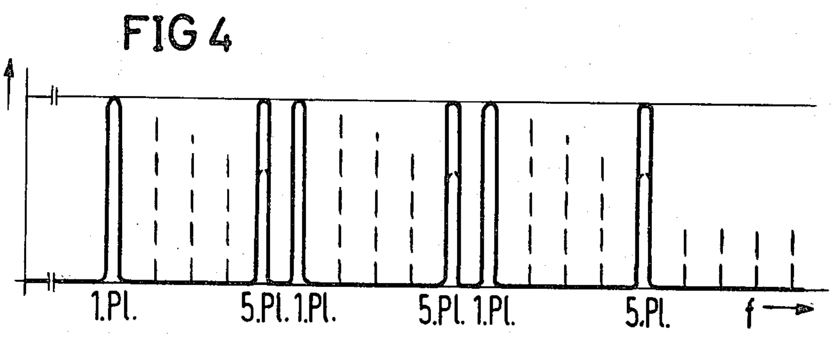
FIG. 4 is a diagram illustrating the course of the signal amplitude for the individual coaxial resonators.

FIG. 4 illustrates the constant signal amplitude that is achieved in the present invention, with the illustration pertaining to a reply device in which each digit is represented by means of two resonant frequencies, respectively comprising five possible frequency locations in the two-out-of-five code. Thus, the frequency f is plotted on the abscissa axis and the amplitude on the ordinate axis. Each digit (first digit, second digit . . . $n^{th}$ digit) has five frequency locations (first location . . . fifth location) allocated to it. Given two frequencies, one respective signal is present, i.e. two resonators are tuned to resonance. Within the tuning range, these signals have a uniform or equal amplitude. For the purposes of comparison, the signal amplitude for a frequency equalization with an additional tuning element of the standard type is indicated in broken lines. In this case, the signal amplitude of the frequency locations 5 is smaller than those of the frequency locations 1.

A resonator of the type described is in no way limited in its employment in an arrangement such as employed for the automatic wireless transmission of multi-place numerical information between active interrogation devices and passive reply devices that are movable with respect to one another, but, can, of course, be employed at any other location desired. It is particularly suitable when, as in the case of the reply device above described, a plurality of resonators are arranged in a narrow space and an individual tuning of the respective resonators is required.

Although we have described our invention by reference to particular illustrative embodiments, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim as our invention:

1. A passive reply device for automatic wireless transmission of multi-place numerical information between active interrogation and passive reply devices which are movable with respect to one another, particularly for track-bound transport means, comprising, a high frequency line section having a high frequency antenna at one end, and short circuited at its opposite end and formed with a plurality of bores, and a plurality of high frequency coaxial resonators received in said bores and extending transversely to and carried by said line section, each resonator formed of a soft metallic material and comprising a tubular member having an open end communicating with the interior of said line section and closed at its opposite end, each resonator being provided with a rod-like coaxial inner conductor stub, said resonators having a like construction with the exception of the respective end walls at their closed ends, the respective resonant frequencies of the respective resonators being derived from differences in configuration of the inner faces of said resonator end walls, which due to the application of axial force to said end walls may vary from convex shape to concave shape, depending upon the direction and amount of said axial force each of said resonators being disposed in a respective cooperable bore in said line section, with their open ends communicating with the interior of said line section and retained therein by a press fit.

2. A reply device according to claim 1, wherein said metallic material is aluminum.

3. A reply device according to claim 1, wherein each resonator is provided at the exterior side of the end wall thereof with an integrally formed projection which extends outwardly therefrom, by means of the axial force may be applied to said end wall.

4. A reply device according to claim 3, wherein said projection is axially aligned with the inner conductor of the associated resonator.

5. A reply device according to claim 1, wherein the line section and associated antenna are divided into two sections on a plane containing the axis of the associated line section.

6. A method of making a reply device, for example, for use in automatic wireless transmission of multi-place numerical information between it and an active interrogation device which are movable with respect to one another, particularly for trackbound transport apparatus, which reply device comprises a plurality of high frequency resonators coupled to a high frequency line section, comprising the steps of fabricating a plurality of like coaxial resonators, each comprising a hollow tubular cylinder closed at one end and having an integrally formed rod-like coaxial inner conductor therein, said resonators being constructed of a soft malleable metallic material, forming a high frequency line section with bores therein intersecting the line section at the desired resonator locations, each being of a size to receive a resonator therein with a press fit, selectively deforming by application of an axial force the closed end walls of respective resonators to impart thereto a convex or concave internal bottom wall configuration depending upon the amount and direction of said axial force, for effecting predetermined frequency shifts in their resonant frequencies in accordance with the particular resonant frequencies required, and mounting the respective resonators in associated bores in said line section.

7. A method according to claim 6, wherein the line section is fabricated in two cooperable semi-cylindrical half section, and assembling the two half-section to form the line section.

8. A method according to claim 6, wherein the resonators are formed with a projection extending coaxially outward from the outer face of the bottom wall of each resonator, and applying tension or compression forces to such a projection during said deforming operation for imparting to such end wall the desired concave or convex internal configuration.

9. A method according to claim 6, comprising forming said resonators by a cold deforming operation.

10. A method according to claim 6, comprising forming said resonators by a cutting operation.

11. A method according to claim 6, wherein said soft malleable metallic material is aluminum.

* * * * *